United States Patent

[11] 3,599,101

[72] Inventor John F. Merrill
Wappingers Falls, N.Y.

[21] Appl. No. 837,569
[22] Filed June 30, 1969
[45] Patented Aug. 10, 1971

[73] Assignee International Business Machines Corporation
Armonk, N.Y.

[54] SOLID STATE DIRECT CURRENT TESTER FOR MICROCIRCUITS
4 Claims, 1 Drawing Fig.

[52] U.S. Cl. .......... 328/97, 307/242, 330/69, 330/85, 330/110
[51] Int. Cl. .......... H03k 17/00
[50] Field of Search .......... 300/30, 30 D, 69, 85, 110; 328/95—97; 307/242

[56] References Cited
UNITED STATES PATENTS
3,516,002 6/1970 Hillis .......... 330/85 X

*Primary Examiner*—Roy Lake
*Assistant Examiner*—James B. Mullins
*Attorneys*—Hanifin and Jancin and Robert J. Haase

ABSTRACT: A solid state circuit tester including two difference amplifiers, two follower amplifiers, resistors and solid state switches for providing direct current, direct voltage and load simulation. One of the difference amplifiers is connected in series circuit with a selected one of the resistors and a circuit point to be tested. Negative feedback to the input of the difference amplifier is provided by a selected one of the follower amplifiers which are connected, respectively, to the circuit point to be tested and to the selected resistor. The second difference amplifier is selectively connected to the circuit point to be tested and to the selected resistor for providing an output voltage representing, respectively, the voltage at said circuit point and the current flowing therein.

PATENTED AUG 10 1971 3,599,101
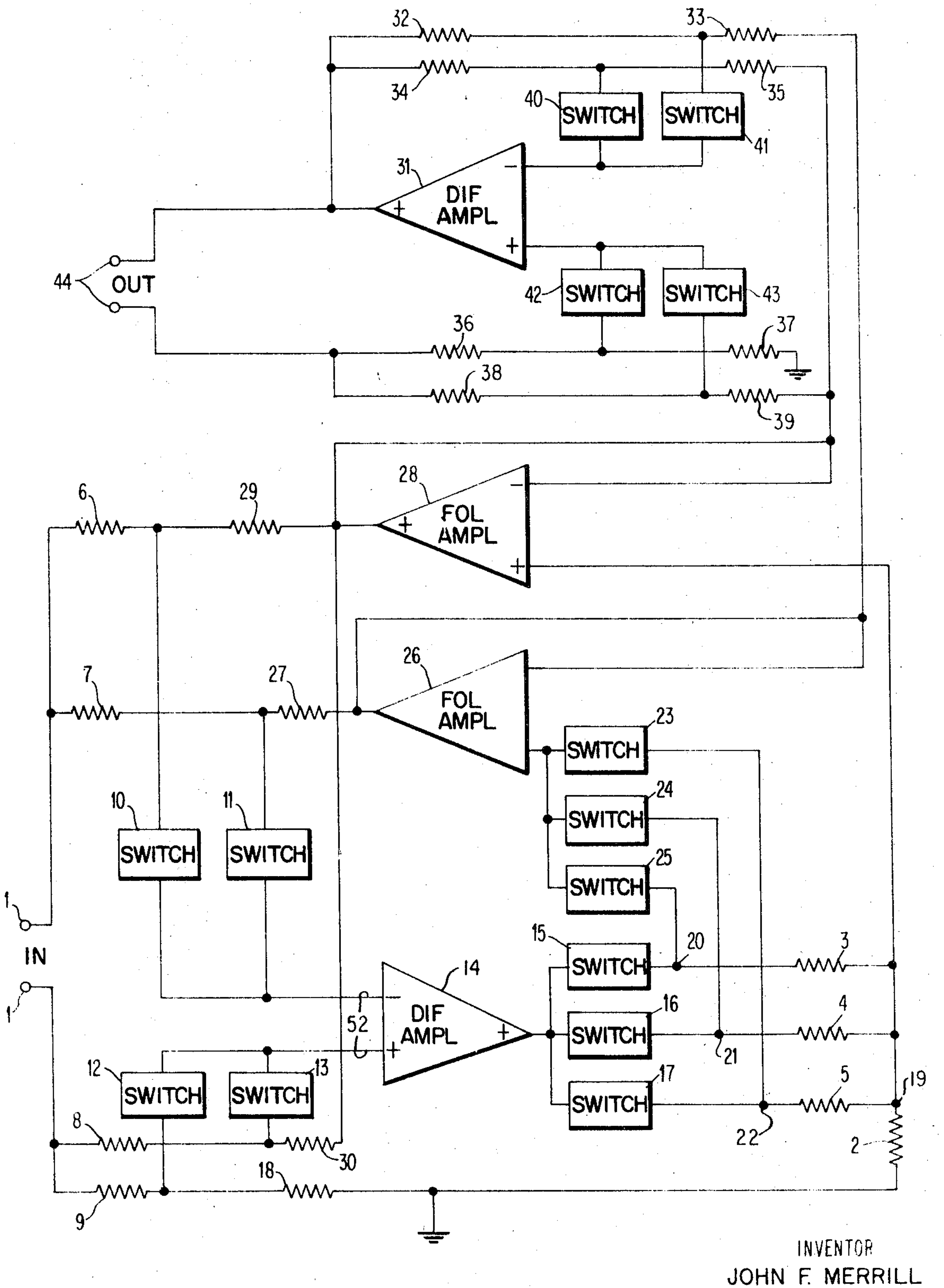
INVENTOR
JOHN F. MERRILL
BY Robert J. Haase
ATTORNEY

SOLID STATE DIRECT CURRENT TESTER FOR MICROCIRCUITS

BACKGROUND OF THE INVENTION

There is a growing need for a high speed, all solid state tester for the application of accurately predetermined current, voltage and load conditions to the individual circuit connection pins of microcircuit devices. The very great number of tests to be made in connection with a modern high volume production line of microcircuit devices makes it imperative that the testing be carried out at high speed and preferably under the control of a digital computer. The tester of the present invention is capable of the establishment and the disruption of current, voltage and load conditions under a computer control and at computer operational speeds without sacrificing the accuracy of the simulated conditions.

SUMMARY OF THE INVENTION

A first difference amplifier, a selected resistor and a circuit point to be tested are connected in series circuit. Solid state switching means are provided for connecting either the selected resistor or the circuit point to be tested back to the input of the amplifier. When the former feedback connection is made, a voltage applied to the input terminals of the difference amplifier is applied to the circuit point to be tested; when the latter feedback connection is made, a voltage applied to the input terminals of the difference amplifier is applied to the selected resistor. Follower amplifiers connected in the respective feedback paths reduce the current in the feedback paths substantially to zero. The result is that the input voltage is either applied to the circuit point to be tested or first converted to a known current and then applied to the circuit point to be tested. The conversion is accomplished by the application of the known input voltage to the selected resistor to produce a known current which also flows into the circuit point to be tested. A second difference amplifier is selectively connected via a respective one of said follower amplifiers to the circuit point to be tested or to the selected resistor to provide an output voltage representing, respectively, the voltage and the current applied to the circuit point.

BRIEF DESCRIPTION OF THE DRAWING

The sole figure is a simplified schematic diagram of a preferred embodiment of the invention.

DESCRIPTION OF THE PREFERRED EMBODIMENT

An input analog voltage representing a desired current, voltage or load condition to be applied for test purposes to a circuit point of interest is applied to input terminals 1. The input voltage is applied or converted into a corresponding current and then applied to the circuit point to be tested, generally represented by load resistor 2. Provision may be made for the automatic selection of voltage and current scale factors. Resistors 3, 4 and 5 are utilized in the preferred embodiment in the selection of current scale factors.

The voltage applied to terminals 1 is applied via resistors 6, 7, 8 and 9 and switches 10, 11, 12 and 13 to the input terminals 52 of difference amplifier 14. Switches 10—13 preferably are field effect transistors or other conventional solid state devices characterized by high operational speed. Switches 10—13 and the other switches to be described preferably are under the control of a computer system (not shown) which is programmed to produce, along with the analog voltage at terminals 1, a predetermined pattern of switch closures and switch openings for the simulation of a desired current, voltage or load condition to resistor 2 in accordance with a prearranged circuit testing procedure. The output of difference amplifier 14 is coupled via switches 15, 16 and 17 and resistors 3, 4 and 5, respectively, to load resistor 2. Load resistor 2 and resistor 18 at the input of difference amplifier 14 are returned to ground.

Provision is made for the application of negative feedback around difference amplifier 14 from the junction 19 between resistors 3, 4 and 5 and resistor 2 or from a selected one of the junctions 20, 21 and 22 between, respectively, switch 15 and resistor 3, switch 16 and resistor 4, and switch 17 and resistor 5. Switches 23, 24 and 25 respectively couple junctions 22, 21 and 20 to the input of follower amplifier 26. Amplifier 26 is a conventional operational amplifier presenting a high input impedance and permitting a negligible feedback current to flow through the feedback path in which it is located. The output of follower amplifier 26 is coupled via resistor 27 and switch 11 to one of the inputs to amplifier 14. Junction 19 is coupled via follower amplifier 28, resistor 29 and switch 10 to the same input of amplifier 14.

It should be noted that two distinct modes of operation of amplifier 14 are permitted relative to load resistor 2 which represents the circuit point to be tested. In the first (voltage) mode of operation, switches 10 and 12 are rendered conductive, switches 11 and 13 are opened and one of switches 15, 16 and 17 is made conductive. Assuming for the sake of simplicity that resistors 6 and 29 are equal and that resistors 9 and 18 are equal, the programmed analog voltage applied to terminals 1 is placed across load resistor 2. In accordance with well known negative feedback amplifier theory, the output voltage across resistor 2 can be maintained arbitrarily close in amplitude to the input voltage applied to terminals 1 by providing sufficient forward gain in amplifier 14. The conduction of switch 10 provides a negative feedback path through follower amplifier 28. A possible alternative feedback path through follower 26 is blocked by the nonconduction of switch 11.

In the other (current) mode of operation of difference amplifier 14, switches 11 and 13 are rendered conductive and switches 10 and 12 are opened. In addition, one of the switches 15, 16 and 17 and a corresponding one of the switches 23, 24 and 25 are rendered conductive to place a selected one of the resistors 3, 4 and 5 in circuit with amplifier 14. It will be noted that the point of feedback around amplifier 14 now has been shifted from junction 19 (mode 1) to a preselected one of the junctions 20, 21 and 22 (mode 2). It should also be noted that the reference point against which the feedback point is compared at the input of amplifier 14 has been shifted from ground (mode 1) to junction 19 (mode 2). More particularly, in mode 1, the plus input to amplifier 14 is connected to ground via switch 12 and resistor 18 whereas in mode 2 the plus input to amplifier 14 is connected to junction 19 via switch 13, resistor 30 and follower amplifier 28. In mode 1, the minus input to amplifier 14 is connected to junction 19 via switch 10, resistor 29 and follower amplifier 28. In mode 2, the minus input to amplifier 14 is connected to a selected one of junctions 20, 21 and 22 via switch 11, resistor 27 and follower amplifier 26. The result is that in mode 1 the voltage across load resistor 2 is fed back to the inputs of amplifier 14 whereas in mode 2 the voltage across a selected one of resistors 3, 4 and 5 is fed back to the inputs of amplifier 14. In either case, the negative feedback action makes the voltage which is fed back equal to the input voltage at terminals 1.

Inasmuch as the resistance values of resistors 3, 4 and 5 are known, the establishment of a predetermined voltage across any one of them also establishes a predetermined current which also flows in substantially its entirety through load resistor 2. Thus, the voltage at input terminals 1 is applied across load resistor 2 in mode 1, whereas a current corresponding to said voltage is applied to load resistor 2 in mode 2.

Provision is made for the monitoring of the voltage or current response of the circuit point being tested with respect to the applied current or voltage. Such monitoring is achieved with the aid of difference amplifier 31, resistors 32—39 and switches 40—43. Amplifier 31, like amplifiers 14, 26 and 28 preferably are solid state devices. Switches 40—43 permit the input of difference amplifier 31 to be connected across either the load resistor 2 or the selected one of resistors 3, 4 and 5. In the former case, junction 19 is coupled through follower 28, resistor 35 and conducting switch 40 to the minus input of amplifier 31. The grounded side of load resistor 2 is connected through resistor 37 and conducting switch 42 to the plus input of amplifier 31. In the second case, junction 19 is coupled via follower 28, resistor 39 and then conducting switch 43 to the plus input of amplifier 31, whereas the junction 20, 21 or 22 corresponding to the selected resistor 3, 4 or 5 is coupled via the corresponding conducting switch 25, 24 and 23, follower amplifier 26, resistor 33 and then conducting switch 41 to the minus input of amplifier 31. Thus, amplifier 31 receives either the voltage across load resistor 2 or the voltage across a selected one of resistors 3, 4 and 5 (representing a corresponding current through load resistor 2) and provides a corresponding output voltage across output terminals 44 for application to a measuring instrument (not shown).

It will be seen that resistors 3, 4 and 5 provide convenient factors for scaling the current to be applied to load resistor 2. Although not shown, a corresponding scale factor for the voltage to be applied to load resistor 2 can be introduced by changing the resistance ratio between resistors 6 and 29 and the resistance ratio between resistors 9 and 18 in a controlled manner.

If it is desired to place a short circuit (zero voltage) across load resistor 2, it is only necessary to place the disclosed apparatus in the voltage mode (wherein the input voltage is applied across load resistor 2) and program a zero input voltage across input terminals 1. Analogously, if an open circuit (zero current) is to be provided across load resistor 2, it is only necessary to place the apparatus in the current mode of operation (wherein the input voltage is applied across a selected one of resistors 3, 4 and 5) and program a zero input voltage at input terminals 1. The resulting zero voltage across the selected resistors 3, 4 or 5 produces a zero (open circuit) current in load resistor 2.

Various modifications are readily made to adapt the disclosed embodiment for the simulation of a voltage source having a series resistor or a current source having a shunt resistor. For example, by connecting one of the junctions 20, 21 or 22 to the minus input of amplifier 14 (as in the current mode of operation) at the same time that the plus terminal of amplifier is returned to ground (as in the voltage mode of operation), the voltage at terminals 1 is applied across one of resistors 3, 4 or 5 and load resistor 2 connected in series circuit. The effect looking back from load resistor 2 (the circuit point to be tested) is that a voltage source having a series resistor is connected thereto. A wide range of resistance values for the series resistor within the simulated voltage source can be obtained by feeding back from junction 19 as well as from one of junctions 20, 21 and 22 simultaneously through respective follower amplifiers and specially weighted resistors (such as resistors 27 and 29) to the minus junction of amplifier 14.

While this invention has been particularly described with reference to the preferred embodiment thereof, it will be understood by those skilled in the art that the foregoing and other changes in form and details may be made therein without departing from the spirit and scope of the invention.

What I claim is:

1. A circuit tester comprising
a first difference amplifier having an input and an output,
at least one resistive means,
the output of said first difference amplifier and said resistive means being connected in series circuit with respect to a circuit point to be tested,
a first follower amplifier,
first switching means selectively coupling said first follower amplifier between said point and the input of said first difference amplifier,
a second follower amplifier, and
second switching means selectively coupling said second follower amplifier between said resistive means and said input of said first difference amplifier,
said first and said second switching means being oppositely operative.

2. A tester as defined in claim 1 and further including
a second difference amplifier having an input and an output,
third switching means selectively coupling the output of said first follower amplifier to the input of said second difference amplifier, nd
fourth switching means selectively coupling the output of said second follower amplifier to said input of said second difference amplifier,
said third and said fourth switching means being oppositely operative.

3. A tester as defined in claim 1 and further including
a plurality of said resistive means and
a corresponding plurality of fifth and sixth switching means,
said fifth switching means coupling said output of said first difference amplifier to a selected one of said plurality of resistive means, and
said sixth switching means coupling the selected resistive means to said second follower amplifier.

4. A tester as defined in claim 3 and further including
a second difference amplifier having an input and an output,
third switching means selectively coupling the output of said first follower amplifier to the input of said second difference amplifier, and
fourth switching means selectively coupling the output of said second follower amplifier to said input of said second difference amplifier,
said third and said fourth switching means being oppositely operative.